United States Patent
Lamarche et al.

(10) Patent No.: US 8,859,892 B2
(45) Date of Patent: Oct. 14, 2014

(54) INTEGRATED SEMICONDUCTOR SOLAR CELL PACKAGE

(75) Inventors: Paul F. Lamarche, Morgan Hill, CA (US); Kyle Jeffrey Russo Tripp, San Francisco, CA (US)

(73) Assignee: Solar Junction Corporation, San Jose, CA (US)

( * ) Notice: Subject to any disclaimer, the term of this patent is extended or adjusted under 35 U.S.C. 154(b) by 0 days.

(21) Appl. No.: 13/224,204

(22) Filed: Sep. 1, 2011

(65) Prior Publication Data

US 2012/0199195 A1    Aug. 9, 2012

Related U.S. Application Data

(63) Continuation-in-part of application No. 13/224,181, filed on Sep. 1, 2011.

(60) Provisional application No. 61/439,082, filed on Feb. 3, 2011, provisional application No. 61/439,095, filed on Feb. 3, 2011.

(51) Int. Cl.
| | |
|---|---|
| *H01L 31/024* | (2014.01) |
| *H01L 31/0203* | (2014.01) |
| *H01L 31/02* | (2006.01) |
| *H01L 31/052* | (2014.01) |

(52) U.S. Cl.
CPC ........ *H01L 31/02008* (2013.01); *H01L 31/052* (2013.01); *Y02E 10/50* (2013.01)
USPC ........................................................ 136/259

(58) Field of Classification Search
CPC ............................ H01L 31/052; H01L 31/076
See application file for complete search history.

(56) References Cited

U.S. PATENT DOCUMENTS

| | | | |
|---|---|---|---|
| 4,180,414 A | 12/1979 | Diamond et al. | |
| 4,491,681 A * | 1/1985 | Kirpich | ......................... 136/246 |
| 4,830,678 A | 5/1989 | Todorof et al. | |
| 4,834,805 A | 5/1989 | Erbert | |

(Continued)

FOREIGN PATENT DOCUMENTS

| | | |
|---|---|---|
| EP | 2254156 A2 | 11/2010 |
| WO | 2011/137305 | 11/2011 |
| WO | 2012/106160 | 8/2012 |
| WO | 2012/106165 | 8/2012 |

OTHER PUBLICATIONS

International Search Report and Written Opinion of the International Searching Authority for PCT Application No. PCT/US2012/022611, mailed on Jun. 21, 2012, 9 pages.

(Continued)

*Primary Examiner* — Jennifer Michener
*Assistant Examiner* — Christopher Danicic
(74) *Attorney, Agent, or Firm* — Kilpatrick Townsend & Stockton LLP

(57) ABSTRACT

A stacked package for a solar cell is provided with a planar arrangement of conductive laminates on the surface of the heat sink. The layered conductive laminate offers multi-directional orientation of the solar cell within the package by eliminating any orientation requirements between the chip and the substrate, and offers multiple options for placement of standard or flipped bypass diodes. The packaged solar cell of the invention provides a smaller horizontal and vertical profile than standard solar cell packages, making it easier to hermetically seal the package.

8 Claims, 14 Drawing Sheets

(56) References Cited

U.S. PATENT DOCUMENTS

| | | | |
|---|---|---|---|
| 4,999,060 A | | 3/1991 | Szekely et al. |
| 5,118,361 A | * | 6/1992 | Fraas et al. ............... 136/246 |
| 5,460,659 A | * | 10/1995 | Krut ............................ 136/246 |
| 5,500,052 A | * | 3/1996 | Horiuchi et al. ........... 136/244 |
| 5,935,345 A | | 8/1999 | Kuznicki |
| 5,944,913 A | | 8/1999 | Hou et al. |
| 6,281,426 B1 | | 8/2001 | Olson et al. |
| 6,623,283 B1 | | 9/2003 | Torigian et al. |
| 7,449,630 B2 | | 11/2008 | Ho et al. |
| 7,514,782 B2 | | 4/2009 | Hiramatsu et al. |
| 7,727,795 B2 | | 6/2010 | Stan et al. |
| 7,851,693 B2 | | 12/2010 | Fork et al. |
| 2004/0119149 A1 | | 6/2004 | Yin Pang et al. |
| 2005/0155641 A1 | | 7/2005 | Fafard |
| 2006/0162768 A1 | | 7/2006 | Wanlass et al. |
| 2006/0163596 A1 | | 7/2006 | Kim et al. |
| 2006/0185716 A1 | | 8/2006 | Murozono et al. |
| 2007/0089774 A1 | | 4/2007 | Lasich |
| 2007/0090517 A1 | | 4/2007 | Moon et al. |
| 2007/0241450 A1 | * | 10/2007 | Hiramatsu et al. ............ 257/712 |
| 2007/0290287 A1 | | 12/2007 | Freedman |
| 2008/0185040 A1 | | 8/2008 | Tom et al. |
| 2008/0190480 A1 | | 8/2008 | Joshi |
| 2008/0230110 A1 | * | 9/2008 | Freedman .................... 136/246 |
| 2008/0315398 A1 | | 12/2008 | Lo et al. |
| 2009/0064994 A1 | * | 3/2009 | Weatherby et al. ........... 126/700 |
| 2009/0086478 A1 | | 4/2009 | Sanroma et al. |
| 2009/0120500 A1 | | 5/2009 | Prather et al. |
| 2009/0159126 A1 | | 6/2009 | Chan |
| 2009/0229659 A1 | | 9/2009 | Wanlass et al. |
| 2009/0255575 A1 | | 10/2009 | Tischler |
| 2009/0272438 A1 | | 11/2009 | Cornfeld |
| 2010/0037935 A1 | | 2/2010 | Vaid et al. |
| 2010/0132765 A1 | | 6/2010 | Cumpston et al. |
| 2010/0139752 A1 | | 6/2010 | Fang |
| 2010/0180936 A1 | | 7/2010 | Kim |
| 2010/0294362 A1 | | 11/2010 | Christ et al. |
| 2010/0313954 A1 | | 12/2010 | Seel et al. |
| 2010/0326429 A1 | | 12/2010 | Cumpston et al. |
| 2010/0326492 A1 | * | 12/2010 | Tan et al. .................... 136/246 |
| 2011/0030764 A1 | | 2/2011 | Seo et al. |
| 2011/0265871 A1 | | 11/2011 | Lamarche |
| 2012/0199194 A1 | | 8/2012 | Lamarche et al. |
| 2012/0199196 A1 | | 8/2012 | Lamarche |

OTHER PUBLICATIONS

International Search Report and Written Opinion of the International Searching Authority for PCT Application No. PCT/US2012/022539, mailed on May 23, 2012, 10 pages.

Non-Final Office Action mailed on Mar. 14, 2013 for U.S. Appl. No. 13/092,555, 12 pages.

Non-Final Office Action mailed on Mar. 14, 2013 for U.S. Appl. No. 13/224,232, 16 pages.

Non-Final Office Action mailed on Nov. 21, 2013, for U.S. Appl. No. 12/944,361, 11 pages.

Non-Final Office Action mailed on Dec. 11, 2013, for U.S. Appl. No. 13/092,555, 12 pages.

Non-Final Office Action mailed on Dec. 19, 2012, for U.S. Appl. No. 13/224,204, 10 pages.

Non-Final Office Action mailed on Mar. 14, 2013, for U.S. Appl. No. 13/224,232, 16 pages.

Non-Final Office Action mailed on Dec. 20, 2013, for U.S. Appl. No. 13/224,181, 10 pages.

International Search Report and Written Opinion corresponding to PCT Application No. PCT/US2011/034485, mailed on Aug. 3, 2011, 9 pages.

International Preliminary Report on Patentability corresponding to the PCT Application No. PCT/US2011/034485, mailed on Nov. 15, 2012, 7 pages.

International Search Report and Written Opinion corresponding to PCT Application No. PCT/US2011/036486, mailed on Aug. 25, 2011, 12 pages.

International Search Report and Written Opinion corresponding to PCT Application No. PCT/US2010/056800, mailed on Jan. 26, 2011, 8 pages.

Cotal et al., "III-V multijunction solar cells for concentrating photovoltaics", Energy and Environment Science, Dec. 10, 2008, pp. 174-192.

Friedman et al., "Breakeven Criteria for the GaInNAs Junction in GaInP/GaAs/GaInNAs/Ge Four-junction Solar Cells", Progress in Photovoltaics: Research and Applications, 2002, pp. 331-344.

Garcia et al., "Analysis of Tellurium As N-Type Dopant in GaInP: Doping, Diffustion, Memory Effect and Surfactant Properties", Journal of Crystal Growth 298 2007, pp. 794-799.

Geelen et al., "Epitaxial Lift-Off GaAs Solar Cell From a Reusable GaAs Substrate", Materials Science and Engineering B45, 1997, pp. 162-171.

Green, "Do Built-in Fields Improve Solar Cell Performance?", Progress in Photovoltaics: Research and Applications, 2009, pp. 57-66.

Jackrel et al., "Dilute nitride GaInNAs and GaInNAsSb solar cells by molecular beam epitaxy", Journal of Applied Physics 101, 114916, 2007, pp. 1-8.

Janotti et. al., "Mutual Passivation of Electrically Active and Isovalent Impurities in Dilute Nitrides", Physical Review Letters 100, 2008, 045505.

Ng et al., "1EV GANXAS1-X-YSBY Material for Lattice-Matched III-V Solar Cell Implementation on GAAS and GE", Photovoltaic Specialists Conference (PVSC), 2009, 34$^{th}$ IEEE, pp. 76-80.

Ptak et al., "Low-acceptor-Concentration GaInNAs grown by Molecular-beam Epitaxy for High-current p—i—n solar cell applications", Journal of Applied Physics 98, 2005, 094501.

Volz et al., "Optimization of Annealing Conditions of (GaIn)(NAs) for Solar Cell Applications", Journal of Crystal Growth 310, 2008, pp. 2222-2228.

Wu et al., "Band Anticrossing in Highly Mismatched III-V Semiconductor Alloys", Semiconductor Science and Technology 17, 2002, pp. 860-869.

Yamaguchi et al., "Multi-junction III-V solar cells: Current status and future potential", Solar Energy, Jul. 2005, vol. 79, Issue 1, Abstract only.

Yu et. al., "Mutual Passivation of Group IV Donors and Nitrogen in Diluted GaNxAs1-x Alloys", Applied Physics Letters, vol. 83, No. 14, Oct. 6, 2003, pp. 2844-2846.

* cited by examiner

INTEGRATED SEMICONDUCTOR SOLAR CELL PACKAGE

CROSS-REFERENCES TO RELATED APPLICATIONS

The present application is a continuation-in-part of U.S. application ser No. 13/224,181, filed on Sep. 1, 2011, entitled "Integrated Semiconductor Solar Cell Package," and also claims benefit under 35 USC 119(e) of U.S. provisional application Ser No. 61/439,082 filed on Feb. 3, 2011, entitled "Integrated Semiconductor Solar Cell Package," and U.S. provisional Application Ser. No. 61/439,095 filed on Feb. 3, 2011, entitled "Flexible Hermetic Semiconductor Solar Cell Package With Non-Hermetic Option," the contents of which are incorporated herein by reference in their entirety.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

This invention relates to packaging for semiconductor photovoltaic devices known generally as solar cells.

Photovoltaic devices present unique problems requiring specialized packaging to achieve desired levels of durability, mechanical integrity, electrical connectivity, maximum thermal transfer, and convenience of mounting. The packaging must also lend itself to a low cost and highly automated manufacturing process. The delicate semiconductor material used as the operative portion of a solar cell must be protected from excessive current by attaching, for example, an additional device such as a bypass diode in parallel with the anode and cathode of the device, an operation nomially accomplished by soldering surface mount plastic packaged devices in a manner that may cause high rates of mechanical failure in actual usage. Further, suppliers of photovoltaic cells and systems are increasingly required to guarantee that their products will operate without replacement for long periods of time, in some cases up to 30 years or more. The packaging for such cells must therefore provide durability as well as reliability.

Current solar cell package designs suffer from design and component limitations that restrict package usage. For example, solar cell packaging to date has relied on ceramics such as aluminum nitride (ALN) and berrylium oxide (BeO) to provide thermally conductive substrates between the heat sink and solar cell. Because of the limited number of suppliers, use of these ceramic substrates increases the cost of manufacturing the solar packaging. Commercialized solar packages also require that the chip, thermally conductive substrates, and heat sink be stacked vertically, increasing the profile of the package and thereby making hermetic sealing of the solar package more difficult and expensive. A further limitation of solar packaging designs in current use is a maximum platform size of 4.5 inches×4.5 inches. An increased platform size would reduce the raw materials input required at the front end of the manufacturing process, ultimately increasing the capacity throughput and minimizing the need for additional capital expenses.

SUMMARY

According to the invention, a stacked component solar cell package is provided that has a planar arrangement of conductive laminates at or below the surface of a heat sink in order to isolate the solar cell electrically from the heat sink. The present invention provides durable and easily manufactured solar chip packages with lower vertical and narrower horizontal profiles, presenting a more versatile package and a less expensive manufacturing alternative to current chip packaging technologies. The described invention further allows for electrical connections to be made between the chip and a protective bypass diode or other external circuitry without the need for complex, time consuming, expensive, and vulnerable plastic packaging and soldered interconnections.

The planar alignment allows more electrical connections below the surface of the heat sink, twice as many as known current solar packages. This layout also reduces the vertical profile of the solar package, allowing it to be more easily sealed (against moisture or hemietically) with the primary and secondary optics.

Also according to the invention, a stacked component solar cell package is provided having one or more thermally-conductive laminates integrated with the heat sink. These conductive laminates comprise non-ceramic PCB-board type materials, allowing more efficient and cost-effective heat dissipation, and eliminate the need for a thermally conductive substrate layer (typically ALN or BeO) between the solar cell and the heat sink. These embodiments allow electrical connections to be made between the chip and a protective bypass diode or other external circuitry without the need for complex, time consuming, expensive, and vulnerable plastic packaged devices. An additional benefit is that the substrate can be embedded within the heat sink during the manufacturing phase, simplifying the assembly process and making assembly of the solar package faster, less expensive, and more easily scalable.

Packaging as described permits the use of standard photovoltaic semiconductor chips having an anode on one surface and a cathode on the other without the need for expensive processing of the chip, extra masks or custom assembly equipment. Use of the invention simplifies the assembly of the solar cell components, both as to the package itself and later for subassembly and connectivity requirements. The package design also allows for scaling the manufacturing process to high volume output in a relatively short time. Additionally, the design allows the solar package to be downsized to ultimately reduce the size of commercial solar arrays. Other benefits from the invention will become readily apparent to those of skill in the arts of semiconductor design and packaging from the following detailed description in connection with the accompanying drawings.

DETAILED DESCRIPTION OF THE INVENTION

Substrate Insert Embodiments

Figure 1:
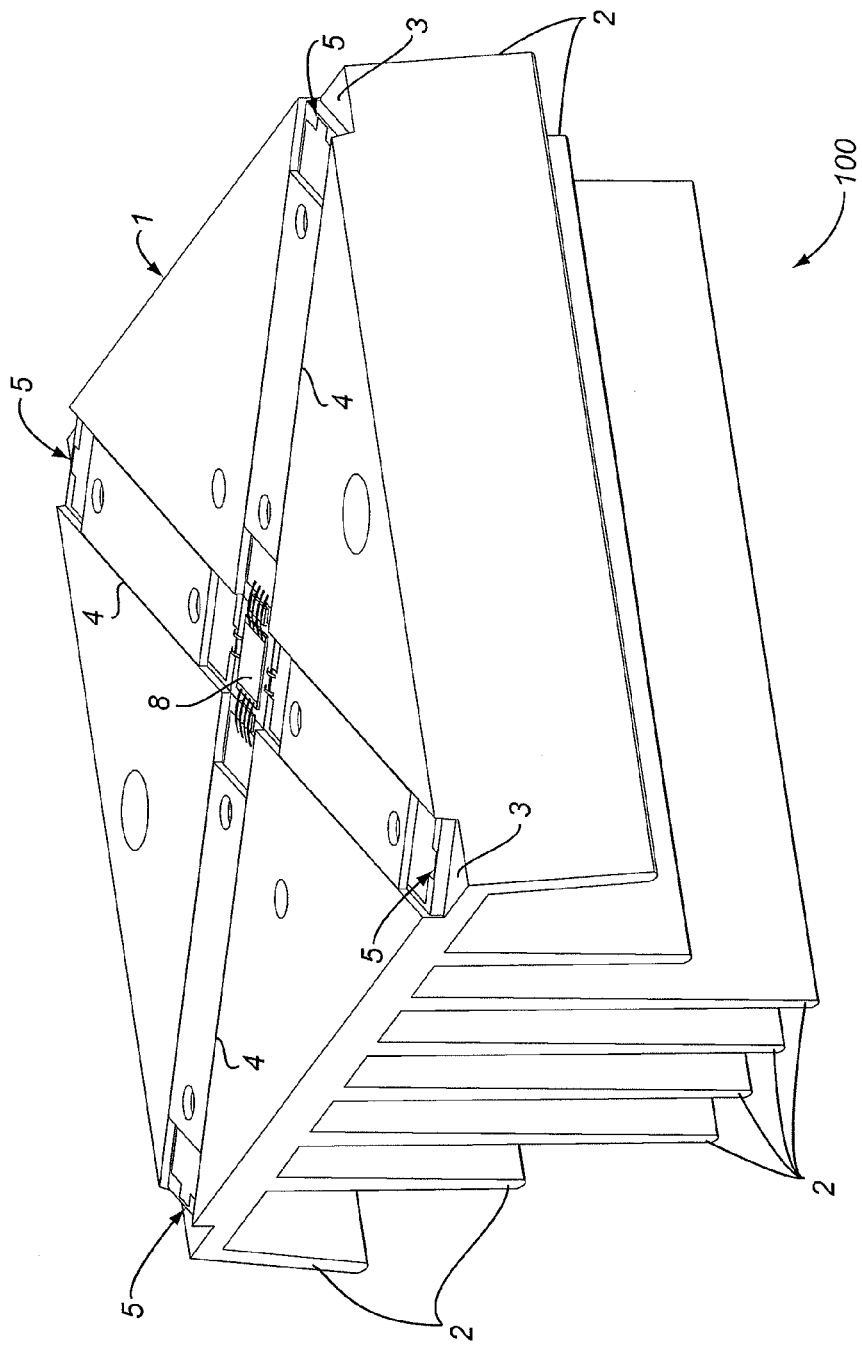
FIG. 1 is a plan view of a finished and packaged solar cell manufactured in accordance with a substrate-insert embodiment of the invention.
Figure 2:
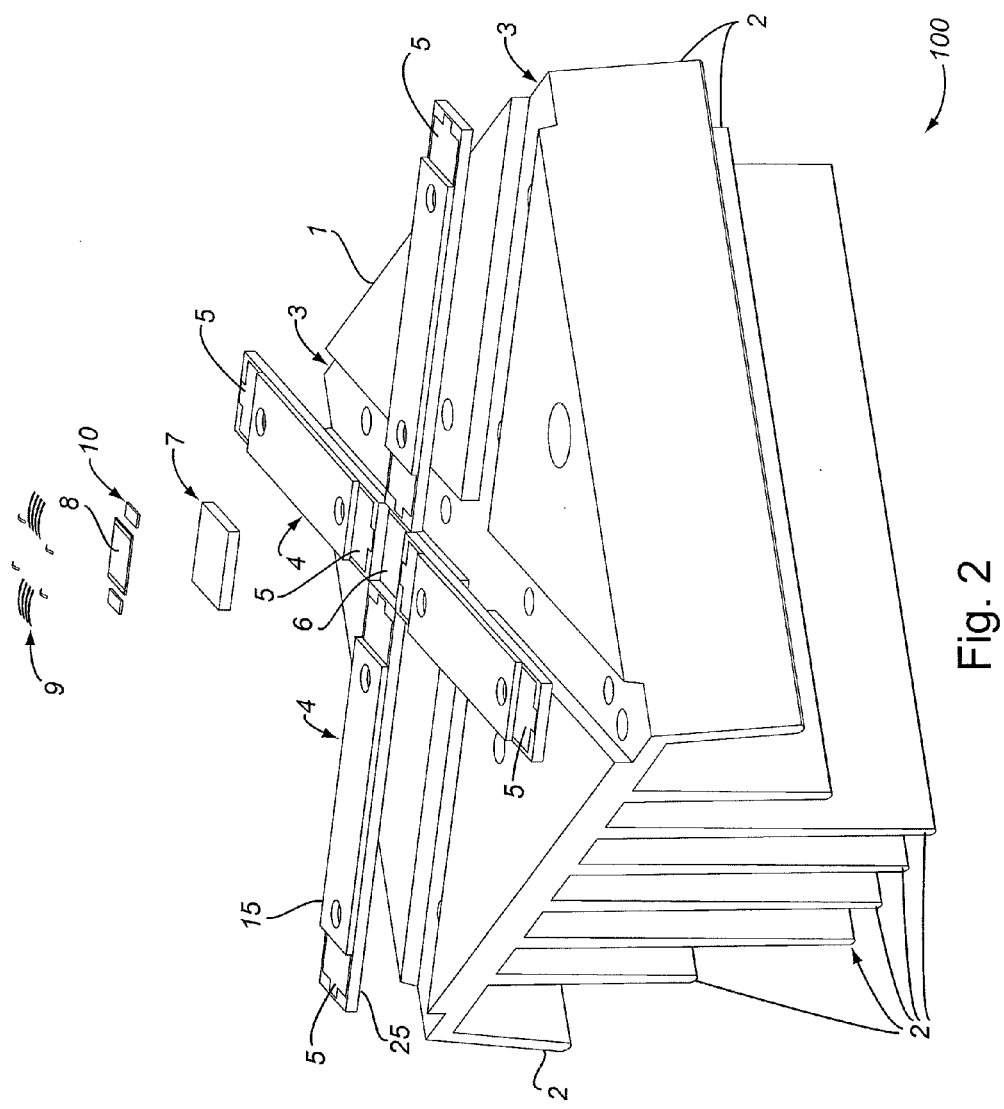
FIG. 2 is an assembly view of one substrate-insert embodiment.

FIG. 1 shows one embodiment of a completed solar cell package assembled from the various stackable components as shown in FIG. 2. The solar cell package includes five components: a multi junction solar chip, bypass diodes, a substrate insert, four conductive laminates, and a heat sink. The solar chip in this embodiment is a III-V multi junction solar cell, but the structure is compatible with other planar chips with any semiconductor material that must be exposed to weather and a wide range of thermal expansion and contraction.

Figure 5:
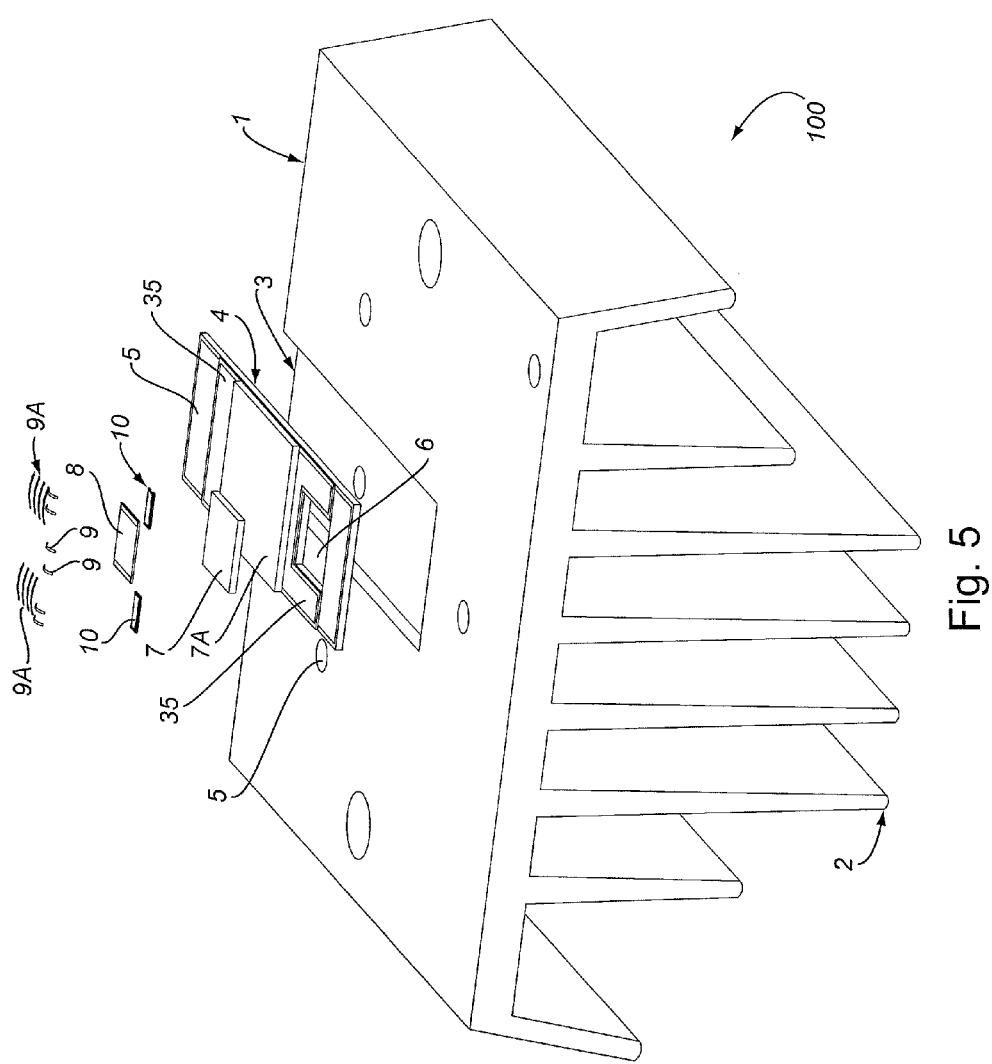
FIG. 5 is an assembly view of a solar package with a single multi-layered conductive laminate with a substrate insert.

Referring to FIGS. 2 and 5, the lowest level of the package is a metal base used as a master heat sink 1. The base is preferably aluminum, but any metal or metallic alloy that is machinable or castable will suffice. The base in this embodiment is a modified flat top heat sink with cooling fins of the sort commercially available (e.g., from AAVID Thermalloy LLC of Concord, N.H.). Several cooling fins 2 protrude from the base of master heat sink 1 to allow thermal dissipation of heat conducted from solar radiation absorbed by the package.

Figure 3:
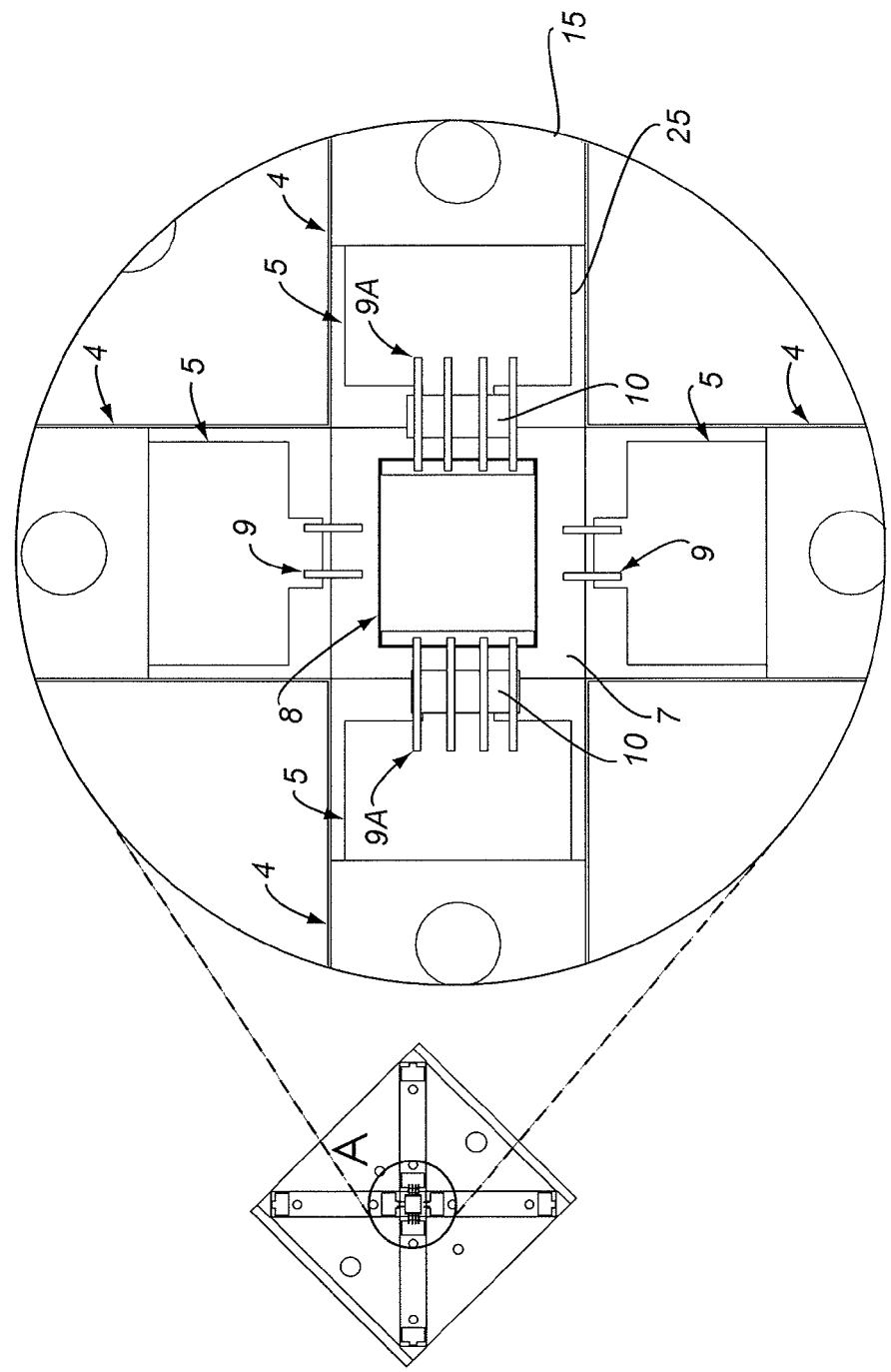
FIG. 3 is a plan view of the one substrate-insert embodiment of the invention showing the solar chip, the substrate insert, flip-chip bypass diodes, and their respective attachments to the conductive laminates.

The upper surface of the heat sink 1 is configured mechanically to have two perpendicular channels 3 designed to seat conductive laminates 4 (FIG. 3). The channels 3 are forged so that when the conductive laminates 4 are seated within, the top surfaces of the laminates 4 are flush with or below the upper surface of the heat sink 1.

Each conductive laminate 4 is a tripartite laminate comprised of a metallic conductive layer sandwiched between sheets of temperature-resistant PCB-type material. One skilled in the art will understand that the board material can be any of a number of higher temperature PCB materials such as, but not limited to, materials from the G10-FR4 family, polyimides, Durastone® of Congoleum Corporation of Mercerville, N.J., or STABLCOR® of Stablecor Technology, Inc. of Huntington Beach, Calif. Other materials with comparable properties may also work. The metallic layer of the laminate is typically Au, Ag, Cu, or gold-plated Cu, but one of skill in the art will recognize that other metals can serve as the conductive layer. The metallic layer is fully encased within the non-conductive layers except for metal fingers 5 exposed at both the proximal and distal ends of each laminate to serve as terminals for electrical connections.

Referring to FIG. 2, the electrically and thermally conductive laminates 4 are bonded to the channels of the heat sink 1 such that the proximal ends of the four laminates create a center cavity 6 larger than the solar chip. A square center cavity is preferred, although other configurations are possible if desired. A variety of thermally-conducting, but electrically non-conductive adhesives or mechanical connections (including e.g., epoxy resins, films, eutectic compositions, solder, cyanoacrylates, mechanical fasters (e.g., conductive, such as metal, or non-conductive, such as plastic), thermosonic bonding, or any combination of the above) may be used to affix the conductive laminates to the channels. Electrically conductive fasteners (e.g., metal screws) may be used, although the fasteners must pass through non-conductive regions created within the conductive laminates during manufacturing. The distal end of each conductive laminate 4 preferably extends to the edge of the base where the exposed metallic finger 5 provides a terminal available for electrical connections, although one skilled in the art will recognize that the conductive laminates can fall short of, or exceed the edge of the base if desired. One of skill in the art will further understand that the metallic fingers 5 can be a variety of shapes and sizes depending on the type of bypass diode (standard, flip-chip, or inverted flip-chip) to be used.

An unpatterned substrate insert 7 fits into the cavity 6, and is attached to the heat sink 1 with a thermal epoxy, solder, or eutectic material, thereby isolating the solar cell electrically from the heat sink. The substrate insert in the embodiment shown (FIG. 2) is comprised of ALN metalized on both the upper and lower surfaces, although other metalized thermally-conductive materials are contemplated, including but not limited to BeO, aluminum oxide, graphite, SiC, ALSiC, and PCTF (with a base material of BeO or ALN). The substrate insert 7 may be the same height as the surrounding laminates 4, but is preferably shorter than the walls of the cavity 6 formed by the laminates so as to minimize the vertical profile of the entire package to facilitate hermetic or anti-moisture sealing if desired. The substrate insert is preferably larger in diameter than the solar cell.

Referring to FIG. 3, the solar cell anode is bonded to the metalized upper surface of the substrate insert 7. Many types of thermal interface material (sometimes referred to as "mastic" or "TIM") may be used as a thermally conductive adhesive and to fill the gaps between the thermal transfer surface at the bottom of the solar cell chip and the upper surface of the substrate insert positioned in the heat sink. In a specific embodiment, Type EK 1000 or a similar mastic such as those manufactured by Dupont may be used, but those skilled in the art will recognize that many types of bonding materials could be used.

Referring further to FIG. 3, the cathode bus bars of the solar chip 8 are connected with wire or ribbon bonds 9 to proximal finger terminals 5 of opposing conductive laminates 4. The substrate insert is wire- or ribbon-bonded to the proximal conductive fingers 5 of the remaining two (perpendicular) laminates 4.

Two bypass diodes 10 (standard configuration, inverted flip-chip, or preferably flip-chip) are connected to the solar chip. The electrical connection for the bypass diodes 10 is achieved by bridging the cathode and anode segments using epoxy or any other joining materials appropriate for that purpose. The bypass diodes 10 bridge the proximal finger contacts 5 of the conductive laminates 4 and the surface of the substrate insert 7 (allowing excess bonding material to fall into the heat sink cavity during manufacture).

Figure 4:
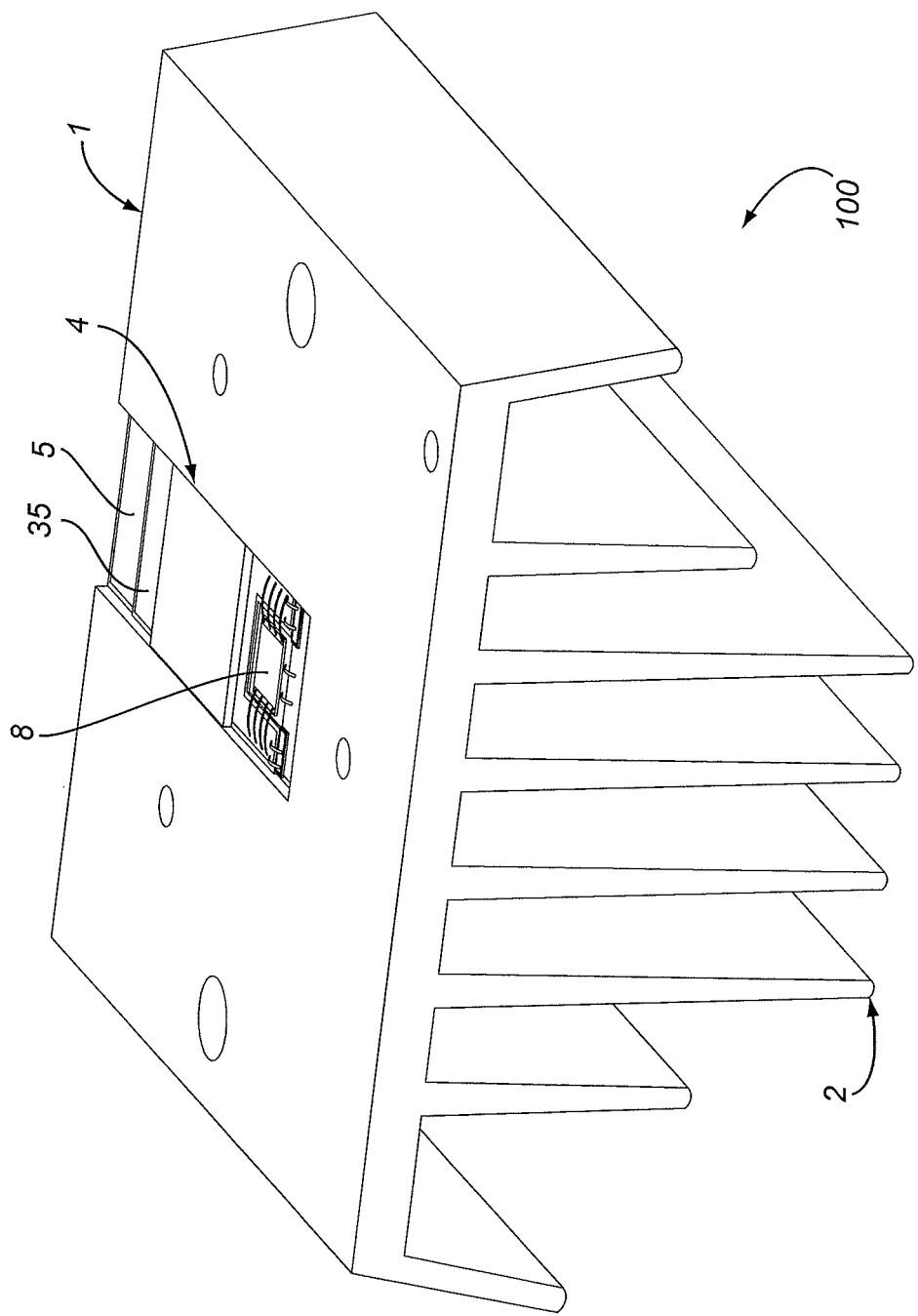
FIG. 4 is a plan view of a finished and packaged solar cell manufactured in accordance with a single multi-layered conductive laminate with substrate-insert embodiment of the invention.

In an alternate embodiment shown in FIGS. 4 and 5, conductive laminate 4 is modified to reduce the horizontal profile of the integrated package with a substrate insert. The solar chip in this embodiment is a III-V multi junction solar cell, but the structure is compatible with other planar chips with any semiconductor material that must be exposed to weather and a wide range of thermal expansion and contraction.

Referring to FIGS. 4 and 5, heat sink 1 in this design has only one channel 3 designed to seat conductive laminate 4. Channel 3 extends from one distal edge of heat sink 1 towards the center of the chip to a distance necessary so that when the chip is attached to the substrate insert 7, the center of the chip (in the x and y planes) lies as exactly as possible over the center (in the x and y planes) of the heat sink.

Figure 5A:
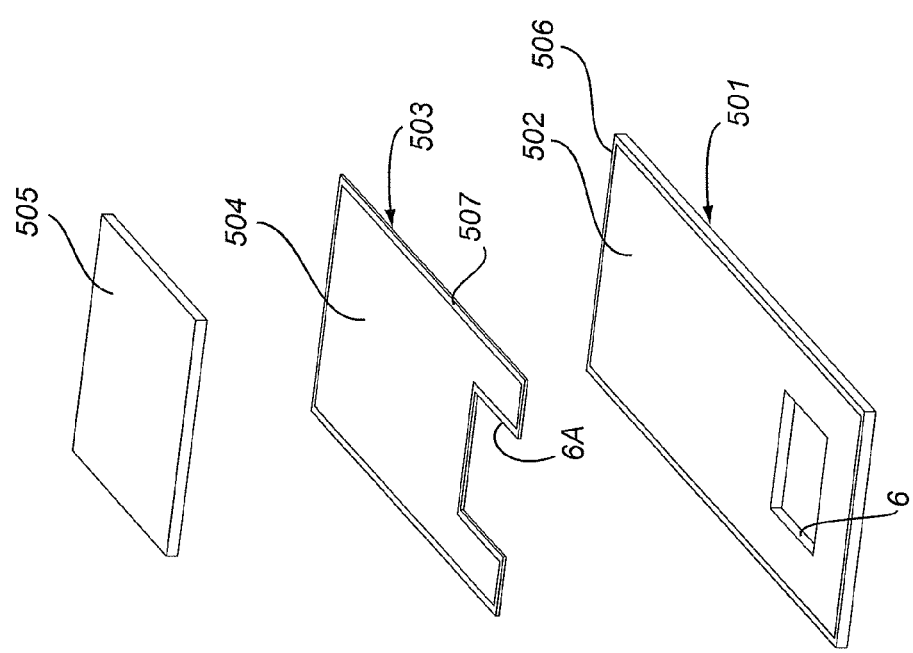
FIG. 5a is an assembly view of a five-layer conductive laminate.

In this embodiment, conductive laminate 4 functions as described above, but the laminar construction is modified. Referring to FIG. 5*a*, electrically and thermally conductive laminate 4 for this embodiment is a five-layer sandwich built, from the bottom up, with: (a) temperature-resistant PCB-type material; (b) a metallic conductive layer; (c) temperature-resistant PCB-type material; (d) a metallic conductive layer; and (e) temperature-resistant PCB-type material. One skilled in the art will understand that the board material for each layer can be any of a number of higher temperature materials such as, but not limited to, materials from the G10-FR4 family, polyimides, Durastone®, or STABLCOR®. The metallic layers of the laminate may be Au, Ag, Cu, or gold-plated Cu, but one of skill in the art will recognize that other metals can serve as the conductive layer.

Referring to FIGS. 5 and 5*a*, metallic bottom layer 502 is bonded to board bottom layer 501 such that a non-electrically conductive border of the board material layer 502 extends beyond all sides of the metallic layer 502. Bottom layers 501 and 502 contain a cavity 6 near the proximal end of the laminate. Middle layers 503 and 504 each have a cutout at its proximal end such that the cutout aligns to maintain cavity 6 when the bottom and middle layers are bonded together. Middle layers 503 and 504 are likewise bonded together such that a non-electrically conductive border of the board material layer 503 extends beyond all sides of the metallic layer 504. When the conductive laminate 4 is assembled, the cutout forms cavity 6 into which the substrate insert fits. The lengthwise profile of middle layers 503 and 504 are shorter than the lengthwise profile of bottom layers 501 and 502 so as to expose metal fingers 5 on bottom layer 502 to serve as terminals for electrical connections. The lengthwise profile of top layer 505 is shorter than the lengthwise profile of middle layers 503 and 504 such that top layer 505 covers most of middle layer 504, leaving exposed metal fingers 15 from middle layer 504 to serve as terminals for electrical connections.

Bottom (501, 502), middle (503, 504), and top (505) layers are bonded together with a thermally-conducting, but non-electrically conductive adhesives (including, but not limited to epoxy resins, films, eutectic compositions, and cyanoacrylates) or thermosonic bonding. One of skill in the art will further understand that metallic fingers 5 can be a variety of shapes and sizes depending on what is needed for electrical connections or bypass diodes. A variety of thermally-conductive, but electrically non-conductive adhesives or mechanical connections (including e.g., epoxy resins, films, eutectic compositions, solder, cyanoacrylates, mechanical fasters (e.g., conductive, such as metal, or non-conductive, such as plastic), thermosonic bonding, or any combination of the above) may be used to affix the conductive laminate 4 to channel 3. Electrically conductive fasteners (e.g., metal screws) may be used, although the fasteners must pass through non-conductive regions created within the conductive laminates during manufacturing.

An unpatterned substrate insert 7 fits into the cavity 6, and is attached to heat sink 1 with a thermal epoxy, solder, or eutectic material, thereby isolating the solar cell electrically from the heat sink. The substrate insert is preferably comprised of ALN metalized on both the upper and lower surfaces, although other metalized thermally-conductive materials are contemplated, including but not limited to BeO, aluminum oxide, graphite, SiC, ALSiC, and PCTF (with a base material of BeO or ALN). Substrate insert 7 may be the same height as surrounding laminate 4, but is preferably shorter than the walls of the cavity 6 formed by the laminates so as to minimize the vertical profile of the entire package to facilitate hermetic or anti-moisture sealing if desired. The substrate insert is preferably larger in diameter than the solar cell.

Referring to FIG. 4, the solar cell anode is bonded to the metalized upper surface of the substrate insert 7. Many types of thermal interface material (sometimes referred to as "mastic" or "TIM") may be used as a thermally conductive adhesive and to fill the gaps between the thermal transfer surface at the bottom of the solar cell chip and the upper surface of the substrate insert positioned in the heat sink. In a specific embodiment, Type EK 1000 or a similar mastic such as those manufactured by Dupont may be used, but those skilled in the art will recognize that many types of bonding materials could be used.

Referring to FIGS. 4 and 5, the cathode bus bars on the upper surface of the solar chip 8 are connected with wire or ribbon bonds 9 to proximal conductive terminal fingers 15 of middle layer 504 of laminate 4. The substrate insert is wire- or ribbon-bonded to the proximal conductive finger terminal 5 of the bottom layer 502 of laminate 4.

Two bypass diodes 10 (standard configuration, inverted flip-chip, or preferably flip-chip) are connected to the solar chip through electrical connections to the conductive terminal fingers 5 and 15. The electrical connection for the bypass diodes is achieved by bridging the cathode and anode segments across the two electrically conductive lines using epoxy or any other joining materials appropriate for that purpose.

Embedded Substrate Embodiments.

Figure 6:
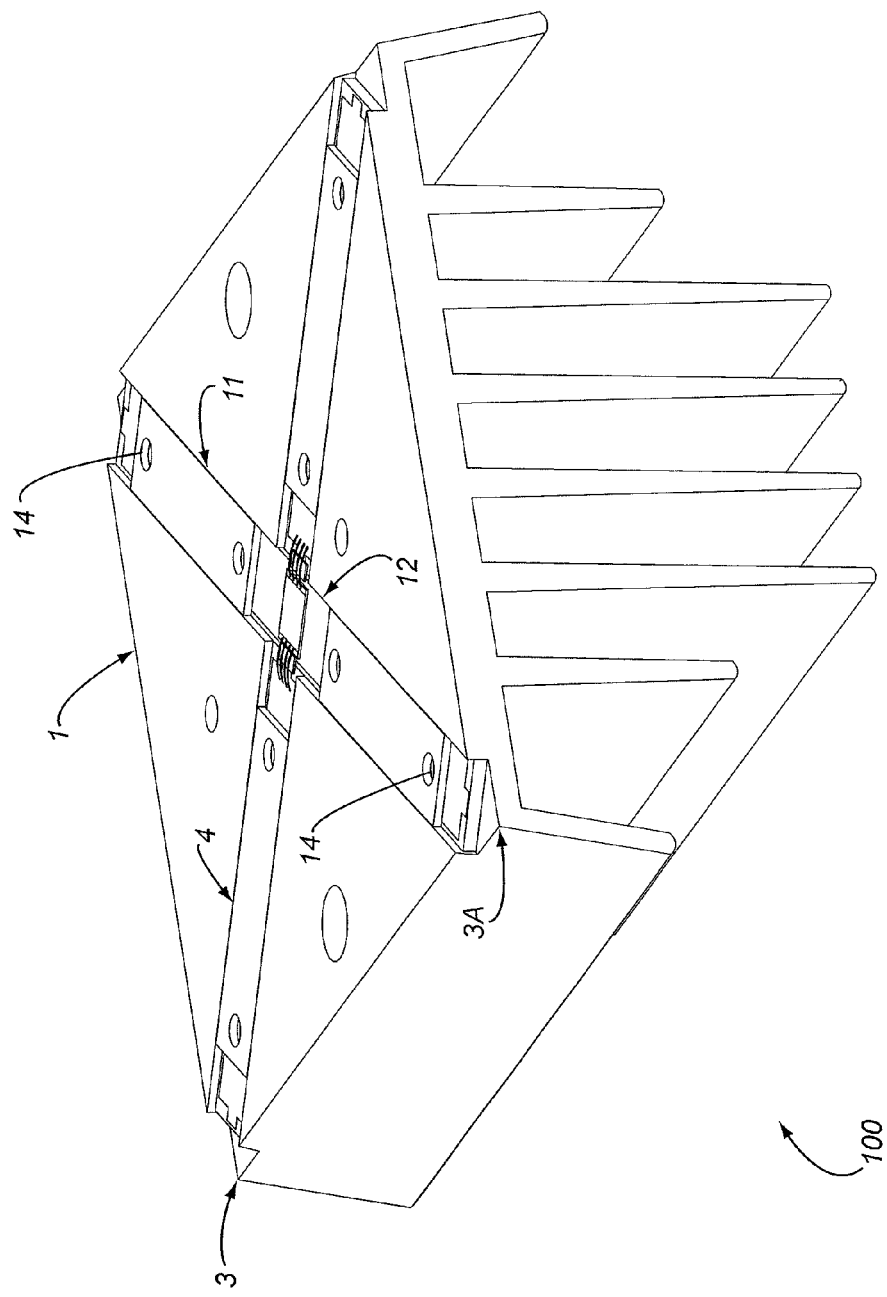
FIG. 6 is a plan view of a finished and packaged solar cell manufactured in accordance with an embedded-substrate embodiment of the invention.
Figure 7:
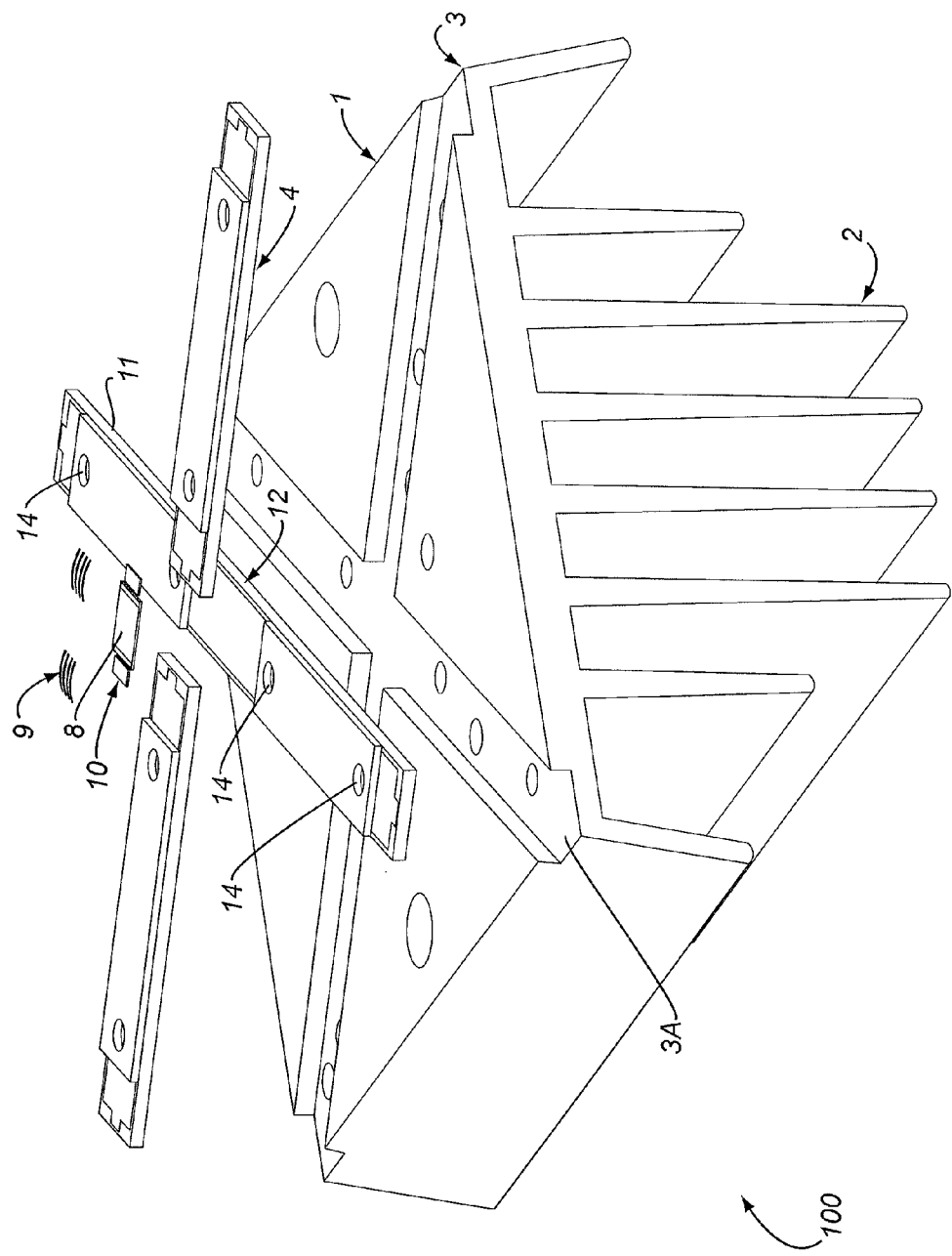
FIG. 7 is an assembly view showing an embedded-substrate embodiment with two short conductive laminates along one axis of the heat sink and a third longer conductive laminate with an embedded substrate along the perpendicular axis of the heat sink.

In an alternate embodiment as illustrated in FIGS. 6 and 7, an integral heat sink is embedded within the board material of the conductive laminate. The solar chip in this embodiment is a III-V multi-junction solar cell, but the structure is compatible with other planar chips with any semiconductor material that must be exposed to weather and a wide range of thermal expansion and contraction.

More specifically, and referring to FIG. 6, in this embodiment, a single extended substrate-embedded thermally and electrically conductive laminate 11 is attached within the channel 3 along one axis of the heat sink 1, while the channel 3 along the perpendicular axis contains the same conductive tripartite laminates 4 as described above (i.e., terminating proximally near the center of the heat sink). The substrate-embedded laminate 11 and the conductive laminates 4 may be affixed to the channels 3 of heat sink 1 with a variety of thermally-conductive but non-electrically conductive adhesives or mechanical connections (including e.g., epoxy resins, films, eutectic compositions, solder, cyanoacrylates, mechanical, fasters (e.g., conductive, such as metal, or non-conductive, such as plastic), thermosonic bonding, or any combination of the above), although if electrically conductive fasteners (e.g., metal screws) are used, the fasteners must pass through non-conductive regions created within the substrate-embedded and/or conductive laminates during manufacturing.

The substrate-embedded laminate 11 is comprised of a modified temperature-resistant PCB-type material with an embedded region 12 containing a thermally conductive material. One skilled in the art will recognize that the board material can be any of a number of higher temperature materials such as, but not limited to, materials from the FR4-G10 family, polyimides, Durastone®, or STABLCOR®. The board material is modified such that the embedded region 12 of the laminate is infiltrated with a thermally and electrically conductive substrate such as, but not limited to, metalized ALN, BeO, aluminum oxide, graphite, SiC, or ALSiC.

One method of infiltrating the thermally conductive substrate is to manufacture the center region of the laminate with multiple thermally and electrically conductive via holes passing from the upper surface of the laminate to the bottom surface. Each via hole is backfilled with a metal (e.g., AL, Cu, Ag, or Au), a composite, or a metal alloy. Alternatively, via holes are metalized along the entire extent of their inner surfaces and filled with a thermally conductive material, including but not limited to metals, ceramics, alloys, and composites. Alternatively, via holes are machined into the center region of the conductive laminate and then plugged with metallic or metalized ceramic studs. The via holes are both thermally and electrically conductive, allowing heat to be directed to the heat sink and current to be passed through the metallic layer of the laminate to the terminal fingers.

Via holes in the substrate-embedded embodiments are approximately 0.018 inches in diameter, and typically occupy a minimum of 50% of the surface of the laminate center region. One of ordinary skill in the art, however, will recognize that the size and density of via holes can vary and will be determined by the percentage of radiant heat that can be diverted along each of the three possible planes (X, Y, and Z), as well as by process manufacturing concerns.

As shown in FIG. 7, the embedded region 12 in the substrate-embedded embodiments will extend laterally along the laminate beyond the edges of the intersecting conductive laminates. One skilled in the art will understand that the embedded region will extend laterally to a reasonable distance necessary to absorb stray light and redirect it to the heat sink.

Referring to FIGS. 6 and 7, the solar chip electrode bus bars are connected with wire- or ribbon-bonds 9 to the appropriate proximal conductive fingers 5 of laminates 4. One or more flip-chip bypass diodes are connected to the chip and are positioned preferably beneath the cathode wire or ribbon connections to minimize the package profile, although one of skill in the art will understand that the bypass diodes can be positioned in other locations and inverted if desired. Alternatively, a standard bypass diode can be seated on two opposing laminates 4 distal to the proximal conductive fingers 5 of the laminates 4.

The anode surface of the chip is bonded with a conductive (thermally and electrically) adhesive material (e.g., epoxy resins, films, eutectics, solder) to the embedded region 12 of the embedded laminate 11. Because electrically conductive via holes connect the surface of the embedded region 12 through the middle metallic layer of the embedded laminate, allowing electrical conduction to the finger terminals 5 of the embedded laminate 11, no explicit wire- or ribbon-bonding of the chip anode to the laminate 11 is necessary.

Figure 8:
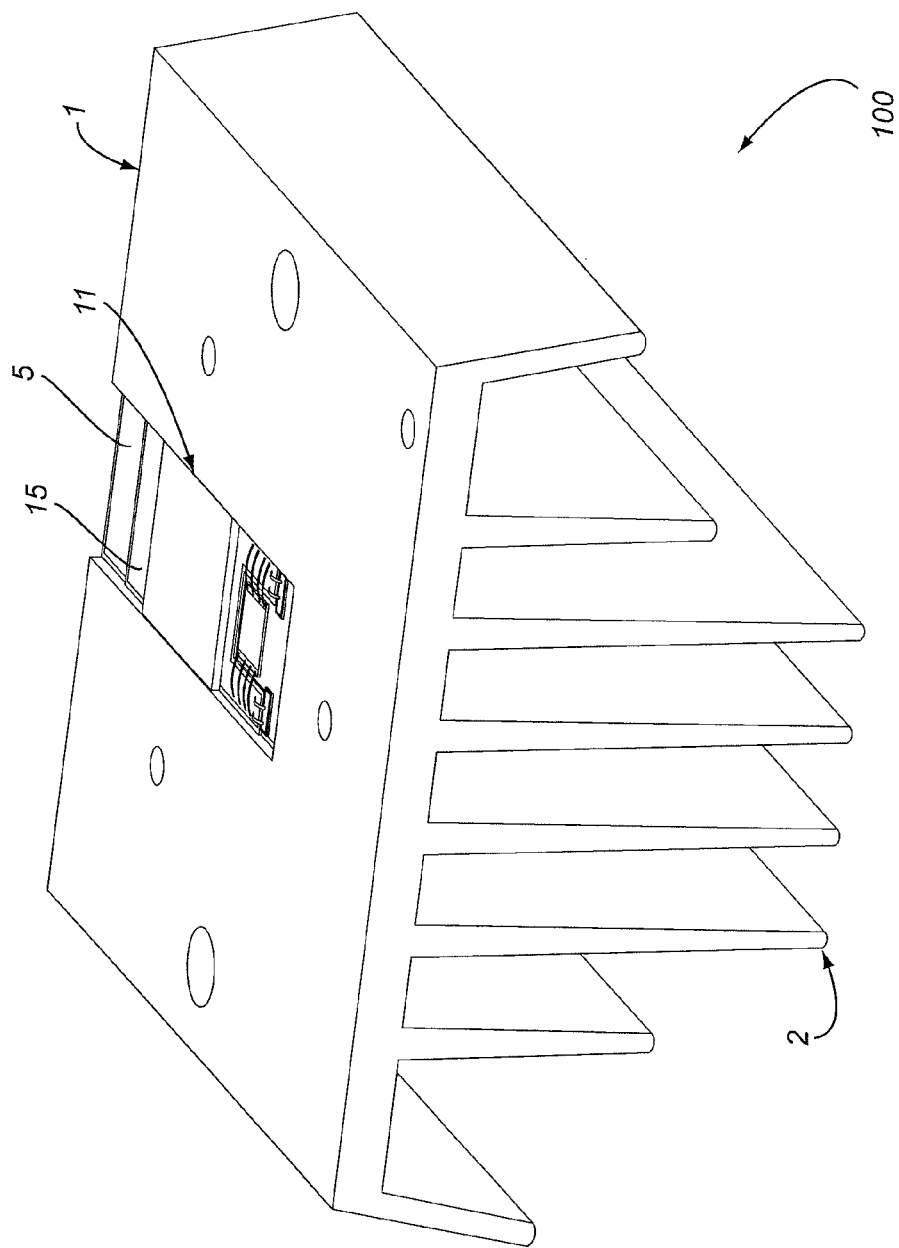
FIG. 8 is a plan view of a finished and packaged solar cell manufactured in accordance with a multi-layered, substrate-embedded laminate embodiment of the invention.
Figure 9:
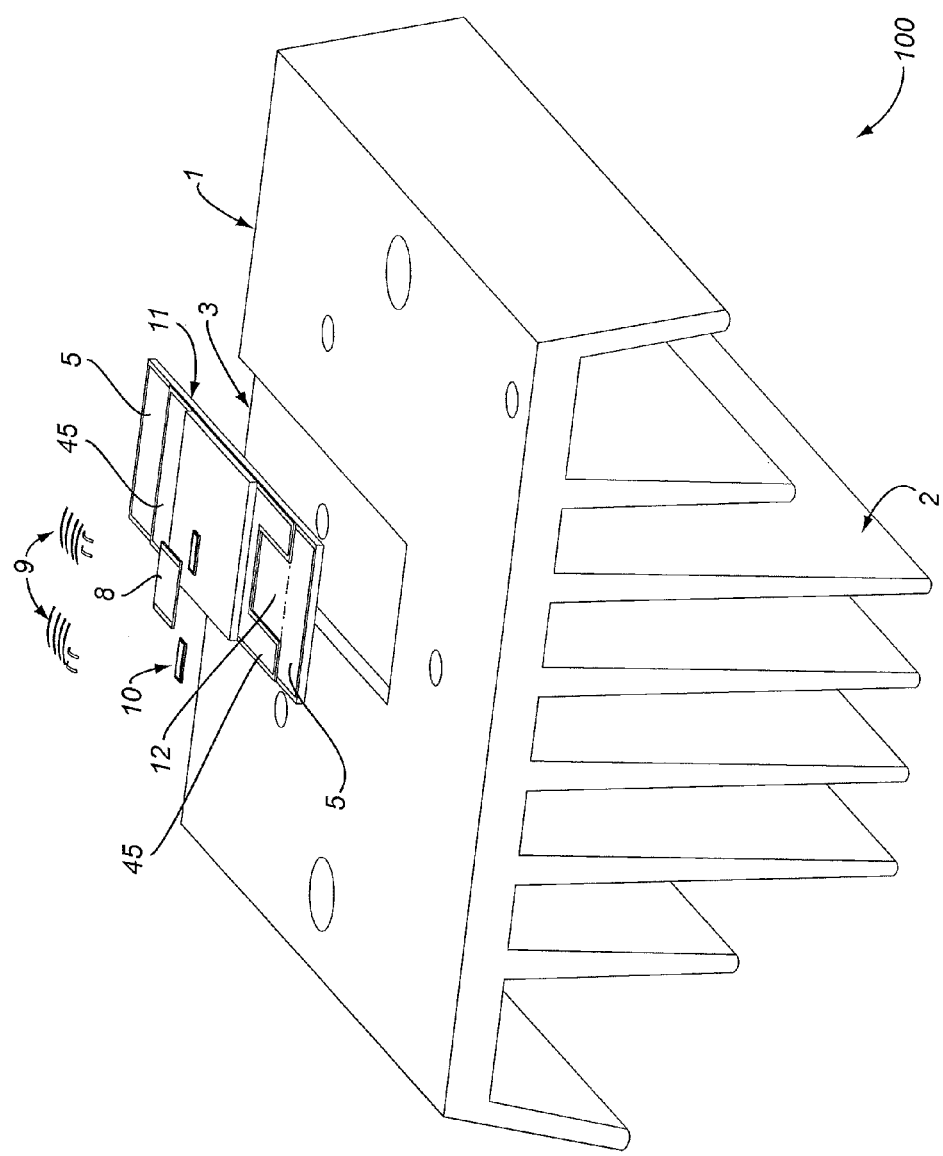
FIG. 9 is an assembly view showing a multi-layered, substrate-embedded laminate embodiment of the invention.

In an alternate embodiment shown in FIGS. 8 and 9, an integral heat sink is embedded within a modified conductive laminate 11, thereby reducing both the horizontal and vertical profile of the integrated package. The solar chip in this embodiment is a III-V solar cell, but the structure is compatible with other planar chips with any semiconductor material that must be exposed to weather and a wide range of thermal expansion and contraction.

Referring to FIGS. 8 and 9, heat sink 1 in this design has only one channel 3 designed to seat modified conductive laminate 11. Channel 3 extends from one distal edge of heat sink 1 towards the center of the chip to a distance necessary so that when the chip is inserted, the center of the chip (in the x and y planes) lies as exactly as possible over the center (in the x and y planes) of the heat sink.

Referring to FIG. 8, in this embodiment, a single modified substrate-embedded thermally and electrically conductive laminate 11 is attached within the channel 3. Substrate-embedded laminate 11 may be affixed to the channels 3 of heat sink 1 with a variety of thermally-conductive but non-electrically conductive adhesives or mechanical connections (including e.g., epoxy resins, films, eutectic compositions, solder, cyanoacrylates, mechanical fasters (e.g., conductive, such as metal, or non-conductive, such as plastic), thermosonic bonding, or any combination of the above), although if electrically conductive fasteners (e.g., metal screws) are used, the fasteners must pass through non-conductive regions created within the substrate-embedded and/or conductive laminates during manufacturing.

Modified substrate-embedded laminate 11 is a five-layer sandwich built as described above for the modified substrate-insert embodiment (FIG. 5a), with one exception. Instead of cavity 6 cut into the bottom layers 501 and 502 of the laminate for substrate insert 7, that region of laminate 11 comprises an embedded region 12 (FIG. 9) containing a thermally conductive material. One skilled in the art will recognize that the board material can be any of a number of higher temperature PCB materials such as, but not limited to, materials from the FR4-G10 family, polyimides, Durastone®, or STABLCOR®. The board material is modified such that the embedded region 12 of the laminate is infiltrated with a thermally and electrically conductive substrate such as, but not limited to, metalized ALN, BeO, aluminum oxide, graphite, SiC, or ALSiC.

One method of infiltrating the thermally conductive substrate is to manufacture the embedded region 12 of the laminate 11 with multiple via holes passing from the upper surface of the laminate to the bottom surface. Each via hole is backfilled with a metal (e.g., AL, Cu, Ag, or Au), a composite, or a metal alloy. Alternatively, via holes are metalized along the entire extent of their inner surfaces and filled with a thermally conductive material, including but not limited to metals, ceramics, alloys, and composites. Alternatively, via holes are machined into the embedded region of the conductive laminate and then plugged with metallic or metalized ceramic studs. The via holes are both thermally and electrically conductive, allowing heat to be directed to the heat sink and current to be passed through the metallic layer of the laminate to the terminal fingers.

Via holes in the substrate-embedded embodiments are preferably 0.018 inches in diameter, and typically occupy a minimum of 50% of the surface of the laminate embedded region. One of ordinary skill in the art, however, will recognize that the size and density of via holes can vary and will be determined by the percentage of radiant heat that can be diverted along each of the three possible planes (X, Y, and Z), as well as by process manufacturing concerns.

As shown in FIG. 9, the embedded region 12 in this embodiment preferably extends laterally along the laminate only to the proximal edges of middle layers 503 and 504. One skilled in the art will recognize that the embedded region can be extended further laterally if desired.

Referring to FIGS. 8 and 9, the solar chip electrode bus bars are connected with wire- or ribbon-bonds 9 to proximal conductive fingers 15 of middle layer 504 of laminate 11. One or more flip-chip bypass diodes may be connected to the chip and are positioned, preferably on proximal terminal finger 5 adjacent to the proximal end of middle layers 503 and 504 of laminate 11, to minimize the package profile, although one of skill in the art will understand that the flip-chip bypass diodes can be positioned in other locations or inverted if desired. Alternatively, a standard bypass-diode can be used.

The anode surface of the chip is bonded with a conductive (thermally and electrically) adhesive material (e.g., epoxy resins, films, eutectics, solder) to the embedded region 12 of the substrate-embedded laminate 11. Because electrically conductive via holes connect the surface of the embedded region 12 through the lower metallic layer 502 of the embedded laminate, allowing conduction to finger terminals 5 of the embedded laminate 11, no explicit wire- or ribbon-bonding of the chip anode to the laminate 11 is necessary.

Multi-Directional Embedded Substrate Embodiments.

Figure 10A:
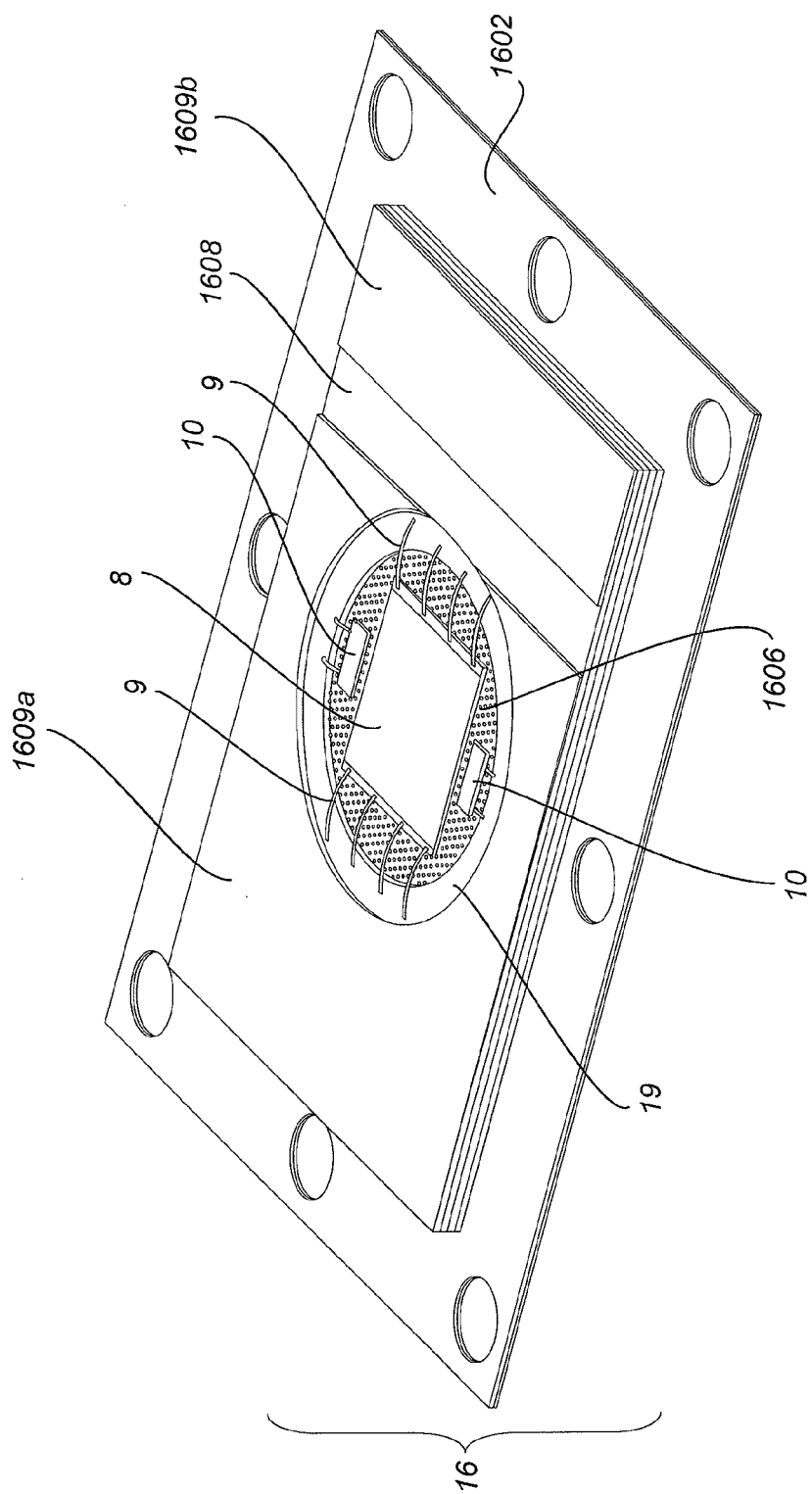
FIG. 10a is a side elevation view of a finished and packaged solar cell manufactured in accordance with a multi-layered, substrate-embedded embodiment of the invention.
Figure 10B:
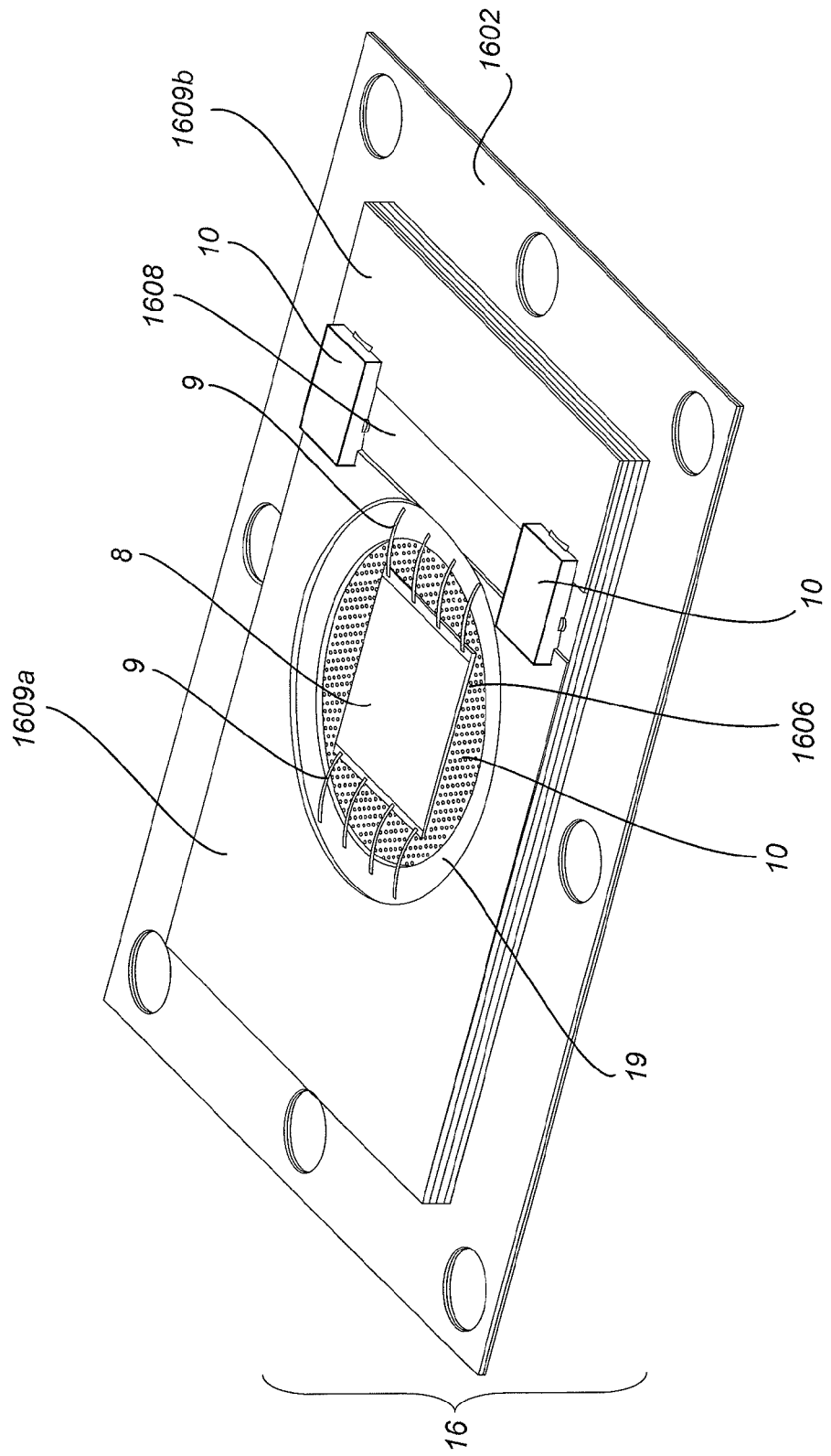
FIG. 10b is a side elevation view of a finished and packaged solar cell manufactured in accordance with a multi-layered, substrate-embedded embodiment of the invention.
Figure 11:
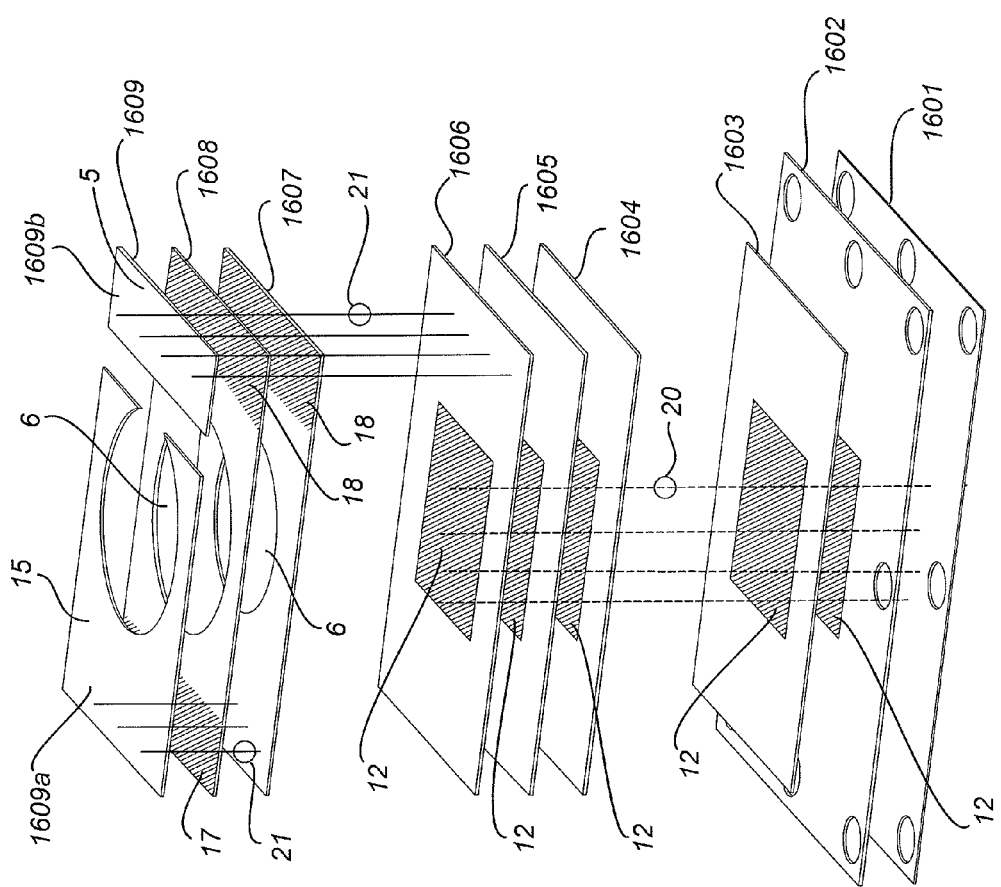
FIG. 11 is an exploded view of a multi-layered laminate manufactured in accordance with a multi-directional embedded substrate embodiment of the invention.

Alternatively, the substrate-embedded embodiment of the invention can be modified for multi-directional electric connectivity. In this embodiment, as shown in FIGS. 10a, 10b and 11, the thermally and electrically conductive laminate is modified such that a solar cell can be mounted on the embedded substrate in any x-y planar orientation. The solar chip in this embodiment is a III-V multi junction solar cell, but the structure is compatible with other planar chips with any semiconductor material that must be exposed to weather and a wide range of thermal expansion and contraction.

Referring to FIGS. 10a, 10b, and 11, electrically and thermally conductive laminate 16 for this embodiment is a nine-layer stack of tripartite sandwiches built, from the bottom up, with: (a) a metallic conductive layer 1601; (b) a temperature-resistant PCB-type material layer 1602; (c) a metallic conductive layer 1603; (d) a metallic conductive layer 1604; (e) a modified thermally conductive and electrically non-conductive material layer 1605; (f) a metallic conductive layer 1606; (g) a metallic conductive layer 1607; (h) a temperature-resistant PCB-type material 1608; and (i) a metallic conductive layer 1609. The metallic layers of the laminate may be Au, Ag, Cu, or gold-plated Cu, although one skilled in the art will recognize that other metals can serve as the conductive layer. The board material for upper (1602) and bottom (1608) layers can be any of a number of higher temperature materials such as, but not limited to, materials from the G10-FR4 family, polyimides, Durastone®, graphite, TC1050®, or STABLCOR®. The layers of substrate-embedded laminate 16 may be bonded together with a variety of thermally-conductive but non-electrically conductive adhesives (including e.g., but not limited to epoxy resins, films, eutectic compositions, cyanoacrylates, or any combination of the above).

Figure 12:
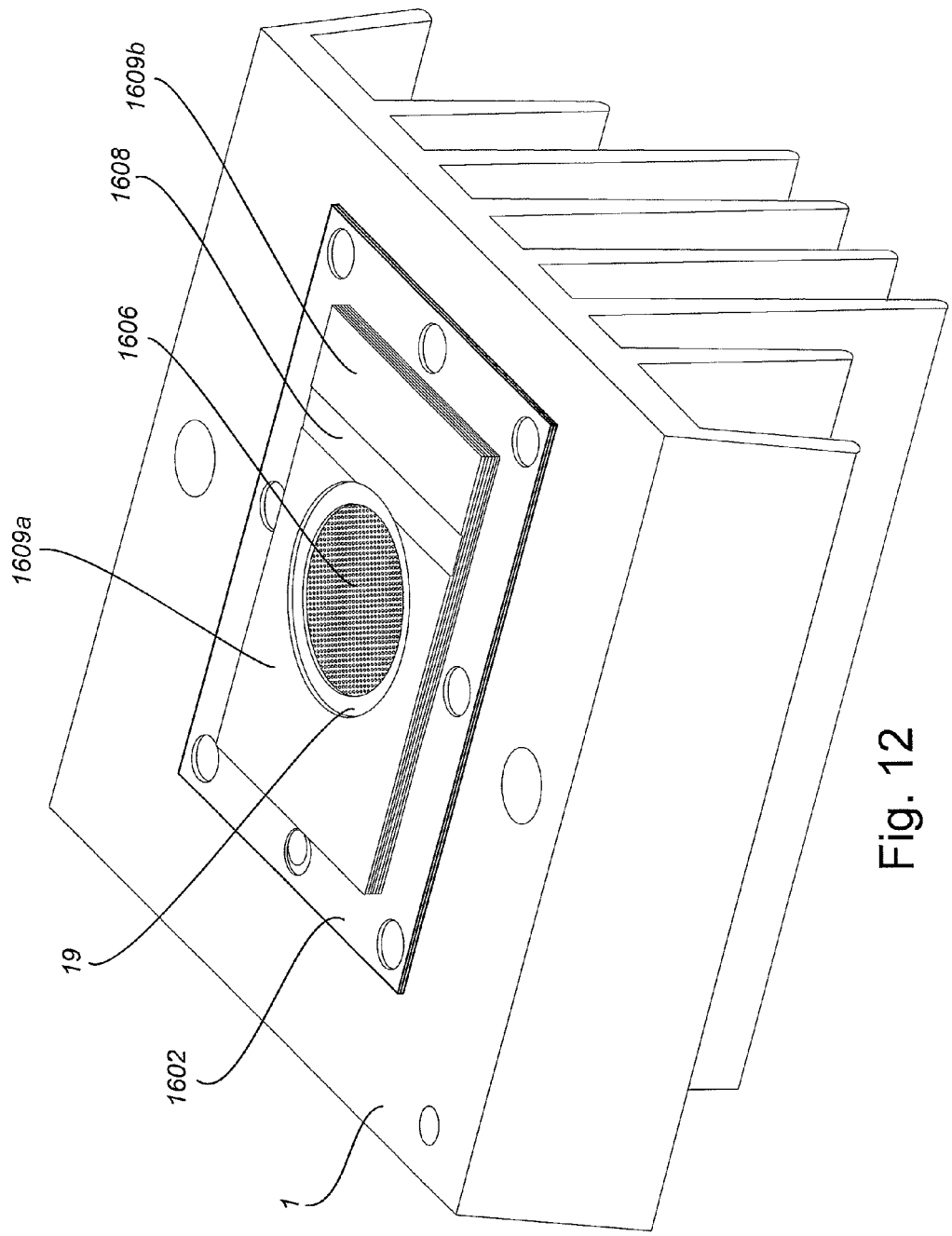
FIG. 12 is an assembly view of the multi-layered conductive laminate of the embodiment shown in FIG. 10.

Referring to FIGS. 11 and 12, the bottom sandwich of laminate 16 has a PCB-type material layer 1602 bonded between metallic layers 1601 and 1603. Layers 1602 and 1603 are modified to be thermally conductive and electrically non-conductive. As discussed above for other substrate-embedded embodiments, a central region 12 within layers 1602 and 1603 is infiltrated, preferably by means of via holes as discussed above, with a thermally conductive material such as, but not limited to, metalized ALN, BeO, aluminum oxide, graphite, SiC, or ALSiC. The lengthwise profile of layers 1601 and 1602 is greater than the lengthwise profile of other layers within laminate 16 to facilitate attachment to a heatsink 1. As with other substrate-embodiments discussed above, a variety of thermally-conductive, but electrically non-conductive adhesives or mechanical connections (including e.g., epoxy resins, films, eutectic compositions, solder, cyanoacrylates, mechanical fasters (e.g., conductive, such as metal, or non-conductive, such as plastic), thermosonic bonding, or any combination of the above) may be used to affix conductive laminate 16 to a generic (e.g., non-channeled) heatsink 1.

Referring to FIG. 11, the middle sandwich of laminate 16 likewise has a modified thermally conductive layer 1605 bonded between metallic layers 1604 and 1606. STABLCOR® S10 is the preferred thermally conductive material for middle layer 1605 because of its thermal wicking properties along x- and y-planes, adjustable coefficient of thermal expansion, and rigidity, although one of skill in the art will understand that the STABLCOR® S10 layer may be replaced with a layer comprised of any other material both thermally conductive and electrically non-conductive material, such as, without limitation, other STABLCOR® products, graphite, TC1050®, or diamond. Thermally conductive layer 1605 and metallic layers 1604 and 1606 are modified as discussed above for other substrate-embedded embodiments such that a central embedded region 12 of each layer is infiltrated, preferably by means of via holes as discussed above, with a thermally conductive substrate such as, but not limited to, metalized ALN, BeO, aluminum oxide, graphite, SiC, or ALSiC.

Referring to FIG. 11, the upper sandwich of laminate 16 has a PCB-type material layer 1608 bonded between metallic layers 1607 and 1609. Top-most metallic layer 1609 comprises two discontinuous sheets of metal which, when bonded to board material layer 1608, are separated by an island of exposed layer 1608. One metal sheet 1609a of layer 1609 is shaped to form the top edge of a cavity 6 when attached to layers 1607 and 1608, and serves as exposed finger terminal 15 available for electrical connections. The other metal sheet 1609b of layer 1609 is electrically isolated from 1609a, and serves as exposed finger terminal 5 available for electrical connections of opposing polarity.

Referring to FIGS. 10a, 10b, 11 and 12, Layers 1607 and 1608 each have a cutout therethrough such that the cutouts align to define cavity 6 when the layers are bonded together. Middle layer 1606 forms the base of cavity 6 which passes through the centers of upper layers 1607, 1608, and 1609. The cutout for layer 1607 is larger than the layer 1608 cutout such that an electrically conductive ledge 19 is formed within the edge of the cavity 6 when layers 1607, 1608, and 1609 are mated. In the preferred configuration, cavity 6 is round, as is conductive ledge 19. Cavity 6 can be sized and shaped as desired by changing the shape and size of layer 1607, 1608, and 1609 cutouts, but will extend beyond the chip borders so as to absorb stray light and redirect it to heat sink 1 (FIG. 12). With the preferred circular configuration of cavity 6 and ledge 19, solar cell 8 can be attached to laminate 16 in any x-y planar orientation without disrupting thermal conduction (20) away from the chip 8 or electrical conduction (21) to and from terminals of the chip 8. In short, the bond pad layout on the substrate eliminates any orientation requirements between chip 8 and the substrate.

One method of infiltrating upper layer 1608 with an electrically conductive substrate is to manufacture lateral embedded regions 17 and 18 within laminate 16 with multiple via holes passing from the upper surface of the laminate to the bottom surface. Each via hole is backfilled with a metal (e.g., AL, Cu, Ag, or Au), a composite, or a metal alloy. Alternatively, via holes are metalized along the entire extent of their inner surfaces and filled with another electrically conductive material, including but not limited to metals, alloys, and composites. Alternatively, via holes are machined into the lateral regions of the conductive laminate and then plugged with metallic studs. Lateral embedded regions 17 and 18 allow current to be passed through metallic layer 1608 of the laminate to terminals 15 and 5 respectively.

Lateral embedded regions 17 and 18 each occupy approximately ⅓ of layer 1608. Lateral embedded region 18 likewise occupies approximately ⅓ of layer 1607. Via holes in the lateral embedded regions are preferably 0.018 inches in diameter, and typically occupy a minimum of 50% of the surface of the lateral embedded region. One of ordinary skill in the art, however, will recognize that the size and shape of the field of via holes, as well as the size and density of the via holes themselves can be varied as desired and will be determined by signal resistivity and process manufacturing concerns.

Referring to FIGS. 10a, 10b, 11, and 12, the anode surface of solar chip 8 is bonded with a thermally and electrically conductive adhesive material (e.g., epoxy resins, films, eutectics, solder) to embedded region 12 of layer 1606 in the assembled laminate 16. Because electrically conductive via holes connect the surface of embedded region 12 through lateral embedded region 18, allowing electrical conduction to finger terminal 5 of embedded laminate 16, no explicit wire- or ribbon-bonding of the chip anode to laminate 16 is necessary.

Referring to FIGS. 10a, 10b, 11, and 12, the solar chip bus bars are connected with wire- or ribbon-bonds 9 to the appropriate finger terminal 15 or conductive ledge 19 of laminate 16. One or more flip-chip bypass diodes are connected to the chip and are positioned preferably beneath the cathode wire or ribbon connections to minimize the package profile, although one of skill in the art will understand that the bypass diodes can be positioned in other locations and inverted if desired. Alternatively, a standard bypass diode can be seated on exposed island of layer 1608 on the upper surface (1609) of laminate 16 and bonded to metallic upper layers 1609a and 1609b.

The foregoing describes an assembly and various embodiments that can be automatically constructed.

The integrated solar cell package can be sealed hermetically or against moisture using a variety of substances and methods, as, for example, by applying a proprietary hermetic conformal coating material that permanently seals the covered surfaces from the environment. Although conformal coatings have been available for many years, they have not generally been sufficiently impermeable to moisture to create true hermetic sealing required by the standards in use today. See, e.g., Mil Spec 883. The preferred conformal coating used in this invention is an alkali silicate glass material compound that will be obtained from Rockwell Collins pursuant to an exclusive license. The material is disclosed in at least the following patent application: U.S. 2009/0068474 A1. Once all of the solar package components are in place, the conformal coating is spray-applied at room temperature to encapsulate the semiconductor and associated electrical connectors and connections (e.g., wire bonds and bypass diodes), and then cured at an elevated temperature. The thickness of the conformal coating will be determined by the manufacturer's specification and may vary from one application to another from a minimum of 40 nm upwards, depending on the lifespan and durability of the coating desired. One of skill in the art will understand that other conformal coatings may be used if desired.

While the foregoing written description of the invention will enable one skilled in the art to make and use the invention, those skilled will understand and appreciate the number of variations, combinations, and equivalents of the specific embodiment, method, and examples herein. The invention should therefore not be limited by the above describes embodiments, methods, and examples, but by all embodiments and methods within the scope and spirit of the invention.

What is claimed is:

1. A package for a solar cell comprising:
   a heat sink comprising an upper surface and defining at least one channel within a portion of the upper surface;
   one or more thermally-conductive laminates disposed within the at least one channel, wherein the one or more thermally conductive laminates define a cavity;
   a thermally conductive insert disposed within the cavity and thermally bonded to the heat sink; and
   a solar cell thermally bonded to the thermally conductive insert;
   wherein a top surface of each of the one or more thermally-conductive laminates and a top surface of the solar cell is flush with or below the upper surface of the heat sink.

2. The package of claim 1 wherein the thermally conductive insert comprises a material selected from aluminum nitride, aluminum oxide, beryllium oxide, graphite, silicon carbide, and aluminum silicon carbide.

3. The package of claim 1 wherein the one or more thermally conductive laminates comprise one or more electrically non-conductive layers comprising a material selected from a glass-reinforced epoxy, a polyimide, an epoxy composite, carbon composite, thermal pyrolytic graphite core encapsulant, graphite, and diamond.

4. The package of claim 1 wherein the solar cell is hermetically sealed.

5. The package of claim 1 comprising one or more bypass diodes, wherein each of the one or more bypass diodes is mounted to at least one of the laminates and electrically connected to the solar cell.

6. The package of claim 1 wherein an upper surface and a lower surface of the thermally conductive insert are metallized with an electrically conductive material.

7. The package of claim 1, wherein the one or more thermally conductive laminate is affixed to the heat sink with a thermally conductive and electrically non-conductive adhesive or mechanical connection.

8. The package of claim 1, wherein the one or more thermally conductive laminates is thermally bonded to the heat sink.

* * * * *